(12) United States Patent
Takagi et al.

(10) Patent No.: US 8,003,299 B2
(45) Date of Patent: Aug. 23, 2011

(54) PHOTOSENSITIVE ORIGINAL PRINTING PLATE FOR RELIEF PRINTING, METHOD FOR PRODUCING RELIEF PRINTING PLATE, AND LIGHT-SHIELDING INK FOR PERFORMING THE METHOD

(75) Inventors: Toshiya Takagi, Kanagawa (JP); Takashi Fujimoto, Kanagawa (JP); Tadahiko Tabe, Tokyo (JP)

(73) Assignee: Eastman Kodak Company, Rochester, NY (US)

( * ) Notice: Subject to any disclaimer, the term of this patent is extended or adjusted under 35 U.S.C. 154(b) by 109 days.

(21) Appl. No.: 11/587,506

(22) PCT Filed: Apr. 25, 2005

(86) PCT No.: PCT/JP2005/008329
§ 371 (c)(1),
(2), (4) Date: Oct. 26, 2006

(87) PCT Pub. No.: WO2005/106585
PCT Pub. Date: Nov. 10, 2005

(65) Prior Publication Data
US 2007/0212647 A1 Sep. 13, 2007

(30) Foreign Application Priority Data
Apr. 30, 2004 (JP) .................. 2004-136720

(51) Int. Cl.
*G03F 7/00* (2006.01)
*G03F 7/26* (2006.01)
(52) U.S. Cl. ............... 430/306; 430/270.1; 430/300; 430/434

(58) Field of Classification Search .............. 430/270.1, 430/300, 302, 434
See application file for complete search history.

(56) References Cited

U.S. PATENT DOCUMENTS
3,458,311 A 7/1969 Alles
(Continued)

FOREIGN PATENT DOCUMENTS
EP 1 072 953 A1 1/2001
(Continued)

OTHER PUBLICATIONS
Larousse Dictionary of Science and Technology, 1995, p. 570.*
(Continued)

*Primary Examiner* — Shean C Wu
*Assistant Examiner* — Chanceity Robinson (57) ABSTRACT

Provided are an original printing plate for relief printing that solves both the problems of the prior-art negative film or its alternatives, and problems of mask pattern formation directly on the surface of the photosensitive resin layer by an ink composition, as well as a method for forming an relief printing plate using the same. Employing a photosensitive original printing plate for relief printing including a support substrate (A); a photosensitive resin layer (B) provided thereon and having a photosensitivity to light in a predetermined wavelength region; and an ink holding layer (C) provided thereon; wherein the layer (C) is capable of retaining a light-shielding ink, and capable of constituting a light-shielding pattern inside the layer (C), the light-shielding pattern being formed by applying the light-shielding ink to the (C) in accordance with the pattern; and wherein the (C) at the area to which the light-shielding ink is not applied is substantially transparent to the light in the predetermined wavelength region.

9 Claims, 1 Drawing Sheet

U.S. PATENT DOCUMENTS

| | | | |
|---|---|---|---|
| 3,794,494 A | | 2/1974 | Kai et al. |
| 4,045,231 A | | 8/1977 | Toda et al. |
| 4,082,554 A | * | 4/1978 | Pattyn et al. ............ 430/568 |
| 4,117,074 A | | 9/1978 | Tiersten et al. |
| 4,311,787 A | * | 1/1982 | Lemahieu et al. ............ 430/522 |
| 4,323,636 A | | 4/1982 | Chen |
| 4,361,640 A | | 11/1982 | Pine |
| 4,430,417 A | | 2/1984 | Heinz et al. |
| 4,431,723 A | | 2/1984 | Proskow |
| 4,442,302 A | | 4/1984 | Pohl |
| 4,460,675 A | | 7/1984 | Gruetzmacher et al. |
| 4,517,279 A | | 5/1985 | Worns |
| 4,726,877 A | | 2/1988 | Fryd et al. |
| 4,753,865 A | | 6/1988 | Fryd et al. |
| 4,894,315 A | | 1/1990 | Feinberg et al. |
| 5,462,590 A | * | 10/1995 | Yui et al. .................... 106/31.43 |
| 6,358,668 B1 | * | 3/2002 | Leenders et al. ............ 430/271.1 |
| 6,387,594 B1 | * | 5/2002 | Kakishita et al. ............. 430/300 |
| 2002/0072011 A1 | * | 6/2002 | Murota et al. ............. 430/273.1 |
| 2005/0227165 A1 | * | 10/2005 | Yamada et al. ............ 430/270.1 |

FOREIGN PATENT DOCUMENTS

| | | |
|---|---|---|
| EP | 1 156 368 A2 | 11/2001 |
| EP | 1 195 645 A1 | 4/2002 |
| EP | 1195645 * | 5/2002 |
| JP | 52-118798 | 5/1979 |
| JP | S54-059936 A | 5/1979 |
| JP | 59-178121 | 3/1986 |
| JP | S61-055173 A | 3/1986 |
| JP | 2003-148468 | 1/1993 |
| JP | H05-011445 A | 1/1993 |
| JP | 08-193829 | 1/1998 |
| JP | H10-010709 A | 1/1998 |
| JP | 2001-356491 | 12/2001 |
| JP | 2002-156746 | 5/2002 |
| JP | 2003-070042 | 11/2003 |
| JP | 2003-330158 A | 11/2003 |
| WO | WO 2005026836 A2 * | 3/2005 |

OTHER PUBLICATIONS

An Office Action issued to counterpart German Application No. 11 2005 000 943.2, mailed Feb. 2, 2009.

Notice of Reasons of Rejection issued in corresponding Japanese Patent Application No. JP 2004-136720, mailed Apr. 7, 2009.

Notice of Reasons for Rejection issued to DE Application No. 112005000943.2, mailed Jan. 7, 2011.

* cited by examiner

FIG.1

PHOTOSENSITIVE ORIGINAL PRINTING PLATE FOR RELIEF PRINTING, METHOD FOR PRODUCING RELIEF PRINTING PLATE, AND LIGHT-SHIELDING INK FOR PERFORMING THE METHOD

CROSS REFERENCE TO RELATED APPLICATION

This application claims the benefit and priority to and is a U.S. National Phase of PCT International Application Number PCT/JP2005/008329, filed on Apr. 25, 2005, designating the United States of America and published in the English language, which claims priority under 35 U.S.C. §119 to Japanese Application Number 2004-136720 filed on Apr. 30, 2004. The disclosures of the above-referenced applications are hereby expressly incorporated by reference in their entireties.

TECHNICAL FIELD

The present invention relates to a photosensitive original plate for forming a relief printing plate such as a flexographic plate and a method for producing the relief printing plate as well as a light-shielding ink for performing the method.

BACKGROUND ART

As is well-known, a photosensitive resin has been used for a recent flexographic plate, and this photosensitive resin is generally composed of an elastomeric binder, at least one monomer and a photopolymerization initiator. An original printing plate using this photosensitive resin is a plate provided with a layer of the photosensitive resin on a support substrate.

In production of a flexographic plate using this original printing plate, first a film (mask) having a negative pattern of an image such as a text and a picture to be printed is placed on the photosensitive resin layer of this original printing plate, and the photosensitive resin layer is then exposed to a chemical ray through this mask. A portion exposed with the chemical ray is cured as a result of a photopolymerization reaction. Thereafter, an uncured portion is washed out with a developer, and then a relief pattern in accordance with the image remains. As a result, the flexographic plate is produced. In the flexography, an ink is put on a top surface of the relief pattern, which is compressed on a printing medium such as paper to carry out printing.

A negative film used as the negative mask is produced by the use of a photographic technique commonly used, i.e., a photochemical technique using silver halide, and thus the production is expensive and steps thereof are complicated. As an alternative to the photographic film, a negative mask which may be produced more simply and inexpensively has been proposed (Patent Document 1: JP-P-2003-330158 A). This negative mask may be produced by the following process: a layer for bearing an ink which may be referred to as an ink receiving layer is provided on a surface of a transparent support substrate such as a polyester film, and printing a negative pattern on this ink bearing layer by an inkjet printer with an ultraviolet light-absorptive ink.

This negative mask may be produced simply and inexpensively, and can be sufficiently used as an alternative to the conventional negative film. However, the negative mask also has similar problems to those of the conventional negative film to be improved, such as follows:

(i) A size of the negative mask may easily alter due to changes of temperature and humidity because the negative mask is composed of a plastic film. Thus, even if the same negative mask is used, each pattern-forming procedure including the light exposure and development of the photosensitive resin layer may result in different accuracy of the printing plate products, due to difference in time and environment for performing the procedure.

(ii) In the pattern forming step, a substance such as dust which inhibits light incidence tends to come in between the negative mask and the photosensitive resin layer. If such a substance has come in, a pattern image obtained after the exposure and the development may be disturbed, which may disgrace printing quality of the printing plate.

In order to solve such problems, Patent Documents 2 and 3 (JP-P-H5-11445 A, and JP-P-H10-10709 A, respectively) disclose direct printing with a UV absorbable ink composition on the surface of the photosensitive resin layer using a printing apparatus such as an inkjet printer and a laser printer, whereby printing a negative pattern.

DISCLOSURE OF THE INVENTION

The original plate for relief printing described in the Patent Documents 2 and 3 has a printed pattern of an ink composition that has directly been printed with the printing apparatus on the surface of a photosensitive resin layer. The printed pattern is then used as a mask for a patterned exposure of the photosensitive resin layer. Thereby, the problems accompanied with the conventional negative film mask or its alternatives may be overcome.

However, since the ink composition is directly printed on the surface of the photosensitive resin layer, this method raises another problem of bleeding and repelling on the printed portion, which may deteriorate file printing pattern.

With this method, the photosensitive resin layer is exposed to atmospheric air and partially covered with the ink composition throughout the processes of formation of the layer, the exposure to light and the development. The ink composition is not designed to sufficiently insulate oxygen, let alone the exposed part of the layer uncovered with the ink composition directly contacts with the oxygen contained in the atmospheric air. When the oxygen directly contacts the photosensitive resin layer upon the light-exposure and the development, deterioration may occur in the exposure and the development. That is, the sensitivity to the light exposure may be decreased, which may lead to low resolution of the resulting pattern configuration after the development.

It is an object of the present invention to provide an original plate for a relief printing which may solve the problems with the conventional negative film and its alternatives, as well as other problems with direct application of the ink composition on a surface of the photosensitive resin layer to form a mask pattern. It is another object of the present invention to provide a method for producing a relief printing plate using the original plate for the relief printing.

In order to solve the above problems, the original plate for the relief printing according to the present invention comprises a support substrate (A); a photosensitive resin layer (B) provided on said support substrate (A), said photosensitive resin layer (B) having a photosensitivity to light in a predetermined wavelength region; and an ink holding layer (C) provided on said photosensitive resin layer (B); wherein said ink holding layer (C) is capable of retaining a light-shielding ink, and capable of constituting a light-shielding pattern inside said layer (C), said light-shielding pattern being formed by applying said light-shielding ink to said ink holding layer (C) in accordance with said pattern; and wherein said ink holding layer (C) at the area to which said light-shielding ink is not applied is substantially transparent to said light in said predetermined wavelength region.

The method for producing the relief printing plate according to the present invention is characterized in that said method comprises the steps of providing a photosensitive laminate as an original plate for relief printing, said laminate having a support substrate (A), a photosensitive resin layer (B) provided on said support substrate (A), said photosensitive resin layer (B) having a photosensitivity to light in a predetermined wavelength region, and an ink holding layer (C) provided on said photosensitive resin layer (B); applying a light-shielding ink to said ink holding layer (C), said light-shielding ink exerting a property to absorb said light in said predetermined wavelength region in said ink holding layer (C), to form a light-shielding pattern in accordance with an image pattern for the relief printing, whereby a part corresponding said image pattern is changed into a mask image layer that shields said light in said predetermined wavelength region as a result of said pattern formation; irradiating said photosensitive resin layer (B) with said light in said predetermined wavelength region using said mask image layer as a mask; and removing using a developing solution a non-irradiated part of said photosensitive resin layer that remains uncured by not being irradiated with said light in said predetermined wavelength region, to form a resin layer having a convex pattern on said support substrate for printing.

The light-shielding ink for producing the relief printing plate according to the present invention is a light-shielding ink to be employed in the method from producing the relief printing plate of the present invention, and contains a water-soluble dye, wherein an aqueous solution of said water-soluble dye absorbs the light in the wavelength region of 300 to 450 nm.

According to the aforementioned features, the light-shielding ink may be retained in the ink holding layer formed on the surface of the photosensitive resin layer without bleeding and repelling, and an integrated mask pattern having sharp edges may therefore be formed on the photosensitive resin layer. The ink holding layer may prevent a desensitization effect of oxygen on the photosensitive resin, and further may appropriately control an oxygen reaching rate (oxygen permeation coefficient) to the photosensitive resin surface. With such features, the photosensitive resin layer obtained by the exposure/development may be controlled in a desired shape of the pattern.

BEST MODE FOR CARRYING OUT THE INVENTION

Constituent factors of the original plate for the relief printing of the present invention will be illustrated in more detail with reference to the following example of the flexographic original plate.

[Support Substrate Layer (A)]

A support substrate layer which constitutes the flexographic original plate of the present invention may be any of support substrates which meet physical performance such as mechanical strength required for a printing condition in a flexographic printing, and examples thereof may be any of publicly known support substrates for usual flexographic printing, such as metals, plastic films, papers and complexes thereof. These include polymer films formed from addition polymerization polymers and linear condensed polymers, transparent foams and fabrics, nonwoven fabrics such as glass fiber fabrics, and metals such as steel and aluminium. The support substrate is preferably transparent to non-infrared ray so that back exposure is facilitated. A more preferable support substrate may include a polyethylene or polyester film, and particularly a polyethylene terephthalate film is favorable. As the film, a film with a thickness of 50 to 300 μm, and preferably a film with a thickness of 75 to 200 μm is used. This support substrate layer may be coated with a thin adhesiveness accelerating layer between the photosensitive resin layer and the support substrate if necessary. As this adhesiveness accelerating layer, for example, a mixture of polycarbonate, a phenoxy resin and polyvalent isocyanate may be suitably used.

[Photosensitive Resin Layer (B)]

A photosensitive resin layer used for the flexographic original plate of the present invention may be formed by a photosensitive resin composition containing an elastomeric binder, one or more sorts of monomers and a photopolymerization initiator, and all of the photosensitive resin compositions suitable for the flexography may usually be used. Examples of the elastomeric binder may include polymers such as a homopolymer, a copolymer and a mixture thereof which have an elastomeric property, and are soluble in, swellable with or dispersible in a developer of an aqueous or an organic solvent, and capable of being washed out. Examples of these binders may include polybutadiene, polyisoprene, polydiolefin, a copolymer and a block copolymer of a vinyl aromatic compound/diolefin, a copolymer of styrene/butadiene, a copolymer styrene/isoprene, a copolymer of diolefin/acrylonitrile, a copolymer of ethylene/propylene, a copolymer of ethylene/propylene/diolefin, a copolymer of ethylene/acrylic acid, a copolymer of diolefin/acrylic acid, a copolymer of diolefin/acrylate/acrylic acid, a copolymer of ethylene/(meth)acrylic acid/(meth)acrylate, polyamide, polyvinyl alcohol, a graft copolymer of polyvinyl alcohol/polyethylene glycol, an amphoteric inter polymer, celluloses such as alkyl cellulose, hydroxyalkyl cellulose and nitrocellulose, a copolymer of ethylene/vinyl acetate, cellulose acetate butyrate, polybutyral, cyclic rubber, a copolymer of styrene/acrylic acid, polyvinyl pyrrolidone, a copolymer of polyvinyl pyrrolidone and vinyl acetate, a chloroprene polymer, a copolymer of styrene-chloroprene, a copolymer of acrylonitrile-butadiene, a copolymer of acrylonitrile-isoprene, a copolymer of acrylonitrile-chloroprene, a copolymer of methyl methacrylate-butadiene, a copolymer of methyl methacrylate-isoprene, a copolymer of methyl methacrylate-chloroprene, a copolymer of methyl acrylate-butadiene, a copolymer of methyl acrylate-isoprene, a copolymer of methyl acrylate-chloroprene, a copolymer of acrylonitrile-butadiene-styrene, a copolymer of acrylonitrile-isoprene-styrene, a copolymer of acrylonitrile-chloroprene-styrene, an epichlorohydrin polymer, a copolymer of epichlorohydrin-ethylene oxide, a copolymer of epichlorohydrin-propylene oxide, epichlorohydrin rubber, chlorinated polyethylene, a vinyl chloride copolymer, a vinylidene chloride copolymer, chlorinated polypropylene, chlorinated ethylene-propylene rubber, a copolymer of ethyl acrylate-acrylonitrile, a copolymer of butyl acrylate-acrylonitrile, a copolymer of methyl methacrylate-acrylonitrile, and a copolymer of butyl acrylate-styrene-acrylonitrile. The polymers may be used alone or in combination. Additional examples of the binders may also include the resins disclosed in U.S. Pat. Nos. 3,458,311, 4,442,302, 4,361,640, 3,794,494, 4,117,074, 4,431,723 and 4,517,279, which are the binders soluble or dispersible in the aqueous developer, and the resins disclosed in U.S. Pat. Nos. 4,323,636, 4,430,417 and 4,045,231, which are soluble in, swellable with or dispersible in the developer of the organic solvent.

One or more sorts of monomers contained in the photosensitive resin layer used for the present invention are required to be compatible with the binder so that the transparent photosensitive resin layer with no haze may be formed.

Examples of the monomers may include aromatic vinyl monomers such as α-methylstyrene, m-methylstyrene and p-methoxystyrene; α,β-ethylenic unsaturated nitrile compounds such as acrylonitrile and methacrylonitrile; acrylates of alkyl alcohols having 1 to 23 carbons such as methyl acrylate, ethyl acrylate, propyl acrylate, n-butyl acrylate, isobutyl acrylate and t-butyl acrylate, and corresponding methacrylates; acrylates of hydroxyalkyl alcohols such as 2-hydroxyethyl acrylate and 2-hydroxypropyl acrylate and corresponding methacrylates; acrylates and methacrylates of alkoxy alkylene glycols such as methoxy ethylene glycol and methoxy propylene glycol; monoesters of unsaturated polyvalent carboxylic acid such as monoethyl maleate, monomethyl fumarate and monoethyl itaconate; diesters such as dimethyl maleate, diethyl maleate, dibutyl maleate, dioctyl maleate, diethyl fumarate, dibutyl fumarate, dioctyl fumarate, dimethyl itaconate, diethyl itaconate, dibutyl itaconate and dioctyl itaconate; acrylamides such as acrylamide, methacrylamide, N,N'-methylenebisacrylamide and N,N'-hexamethylenebisacrylamide, and corresponding methacrylamides; ethylene glycol diacrylate, and diacrylates of glycols such as a diacrylate of polyalkylene glycol (having 2 to 23 alkylene glycol unit) and corresponding methacrylates; diacrylates, triacrylates, tetraacrylates and oligoacrylates of polyvalent alcohols of trivalent or more, such as glycerine, pentaerythritol, trimethylol alkane and tetramethylol alkane (alkane: methane, ethane and propane), and corresponding methacrylates; acrylates having an acid functional group such as 2-acryloyloxyethyl succinate, 2-acryloyloxyethyl hexahydrophthalate and 2-acryloyloxyethyl acid phosphate, and corresponding methacrylates; and the like. These photopolymerizable ethylenic unsaturated monomers may be used alone or in combination with two or more. Additional examples of the monomers may include those described in U.S. Pat. Nos. 4,323,636, 4,753,865, 4,726,877 and 4,894,315.

The photosensitive resin layer contains the monomer at 5 to 30 parts by weight, and preferably 10 to 20 parts by weight based on 100 parts by weight of the binder in the photosensitive resin layer. A monomer content less than the aforementioned range in the flexographic plate is not preferable because abrasion resistance and chemical resistance of a coating film after being cured with exposure of non-infrared radiation may be reduced. The monomer content more than the aforementioned range also is not preferable because the elastomeric property of the photosensitive resin layer may be reduced.

As the photopolymerization initiator, any of publicly known initiators may be used. Examples of such a photopolymerization initiator may include aromatic ketones such as benzophenone; benzoin ethers such as benzoin methyl ether, benzoin ethyl ether, benzoin propyl ether, α-methylolbenzoin methyl ether, α-methoxybenzoin methyl ether and 2,2-diethoxyphenyl acetophenone; substituted and unsubstituted polynuclear quinones; 1-hydroxycyclohexylphenylketone, 2,2-dimethoxy-1,2-diphenylethane-1-one, 2-methyl-1-[4-(methylthio)phenyl]-2-molpholinopropane-1-one, 2-benzyl-2-dimethylamino-1-(4-morpholinophenyl)-butane-1-one, 2-hydroxy-2-methyl-1-phenylpropane-1-one, 2,4,6-trimethylbenzoyldiphenylphosphine oxide, 1-[4-(2-hydroxyethoxy)phenyl]-2-hydroxy-2-methyl-1-propane-1-one, 2,4-diethylthioxanthone, 2-chlorothioxanthone, 2,4-dimethylthioxanthone, 3,3-dimethyl-4-methoxybenzophenone, benzophenone, 1-chloro-4-propoxyxanthone, 1-(4-isopropylphenyl)-2-hydroxy-2-methylpropane-1-one, 1-(4-dodecylphenyl)-2-hydroxy-2-methylpropane-1-one, 4-benzoyl-4'-methyldimethylsulfide, 4-dimethylaminobenzoic acid, methyl 4-dimethylaminobenzoate, ethyl 4-dimethylaminobenzoate, butyl 4-dimethylaminobenzoate, 2-ethylhexyl 4-dimethylaminobenzoate, 2-isoamyl 4-dimethylaminobenzoate, 2,2-diethoxyacetophenone, benzyldimethylketal, benzyl-β-methoxyethylacetal, methyl o-benzoylbenzoate, bis(4-dimethylaminophenyl)ketone, 4,4'-bisdiethylaminobenzophenone, 4,4'-dichlorobenzophenone, benzyl, benzoin, benzoin n-butyl ether, benzoin isobutyl ether, p-dimethylaminoacetophenone, p-tert-butyltrichloroacetophenone, p-tert-butyldichloroacetophenone, 2-(o-chlorophenyl)-4,5-diphenylimidazolyl dimer, thioxanthone, 2-methylthioxanthone, 2-isopropylthioxanthone, dibenzosuberone, α,α-dichloro-4-phenoxyacetophenone, pentyl-4-dimethylaminobenzoate, 9-phenylacridine, 1,7-bis-(9-acridinyl)heptane, 1,5-bis-(9-acridinyl)pentane, 1,3-bis-(9-acridinyl)propane, and the like. Additional examples of the initiators may be those disclosed in U.S. Pat. Nos. 4,460,675 and 4,894,315. The initiators may be used alone or in combination.

It is preferable to contain the initiator in the range of 0.001 to 10% by weight based on a total weight of the photosensitive resin.

Furthermore, additives such as a sensitizer, a heat polymerization inhibitor, a plasticizer and a colorant may be used in the photosensitive resin composition which forms the photosensitive resin layer, depending on a required property. Various methods may be used as a method for preparing this photosensitive resin composition. For example, components may be dissolved and mixed in an appropriate solvent such as hydrocarbons such as chloroform and tetrachloroethylene, ethers such as dibutyl ether, isopropyl ether, dioxane and tetrahydrofuran, ketones such as acetone, diethylketone, methylethylketone, methylisobutylketone, methylpropylketone, and cyclohexanone, esters such as ethyl acetate, n-propyl acetate and n-butyl acetate, and aromatic hydrocarbons such as benzene, toluene and xylene (these organic solvents may be used alone or in combination), and the solution may be poured and spread in a mold. Evaporation of the solvent therefrom may give a plate. Alternatively without using the solvent, the components may also be kneaded in a kneader or a roll mill, and molded into a plate with desired thickness by an extruder, an injection molding machine or a press machine.

The ink holding layer (C) used for the present invention is a coating layer which functions by being directly laminated on the photosensitive resin layer (B). Thus, it is required to be composed of a component which is not compatible and reactive with the photosensitive resin layer (B).

The ink holding layer (C) has at least two properties, i.e., a property to retain a printing ink which forms a light-shielding pattern in accordance with an image pattern without bleeding and repelling, and a property to suppress permeation of oxygen therethrough so that the oxygen does not act upon the photosensitive resin layer (B) unnecessarily.

As one factor to retain the ink without bleeding and repelling, it is important to have an appropriate thickness. Its thickness is preferably 0.5 to 15 μm, and more preferably 1 to 10 μm. The thickness of 0.5 μm or less is not preferable because the amount of the retained ink may be insufficient to sufficiently exert a light-shielding effect. The thickness of more than 15 μm is not either preferable because, although the light-shielding effect may be sufficient, elimination thereof in the development step after the exposure becomes difficult.

Preferable constituents for this ink holding layer (C) may be a resin which has an ink retention ability, and is soluble in, dispersible in or swellable with a water-soluble solvent or a water-soluble organic solvent is suitable. Examples of such a water-soluble resin may include hydroxyethylcellulose, hydroxypropylcellulose, hydroxyethylmethylcellulose, hydroxypropylmethylcellulose, hydroxybutylmethylcellulose, methylcellulose, sodium carboxymethylcellulose, sodium carboxymethylhydroxyethylcellulose, water-soluble ethylhydroxyethylcellulose, cellulose sulfate, polyvinyl alcohol, a copolymer of vinyl alcohol, polyvinyl acetate, polyvinyl acetal, polyvinyl pyrrolidone, polyacrylamide, a copolymer of acrylamide/acrylic acid, a copolymer of styrene/acrylic acid, a copolymer of ethylene-vinyl acetate, a copolymer of vinyl methyl ether/maleic acid, poly(2-acrylamide-2-methylpropanesulfonic acid), poly(diethylenetriamine-adipic acid copolymer), polyvinyl pyridine, polyvinyl imidazole, polyethylene oxide, polyurethane, melamine resin, gelatin, carrageenan (carrageenin), dextran, gum arabic, casein, pectin, albumin, starch, a collagen derivative, collodion and agar. Among them, polyvinyl acetal such as polyvinyl butyral, polyvinyl pyrrolidone, polyacrylamide polyurethane and polyvinyl alcohol are preferable.

An oxygen permeation coefficient of the ink holding layer (C) in the invention is not particularly limited as long as it falls within the range for avoiding deterioration of pattern profile of the photosensitive resin layer (B) by oxygen. The suitable range of such an oxygen permeation coefficient is $1 \times 10^{-17}$ to $9 \times 10^{-5}$ (cm$^3$·cm/cm$^2$·sec·cmHg). The oxygen permeation coefficient may be come down to a nearly complete block of the oxygen permeation, but it is possible to control the pattern profile of the photosensitive resin layer (B) by the exposure/development by controlling the oxygen permeation coefficient to allow a small amount of oxygen to permeate. For example, the oxygen permeation coefficient set at $1 \times 10^{-14}$ to $9 \times 10^{-10}$ (cm$^3$·cm/cm$^2$·sec·cmHg) allows the small amount of oxygen to exist on the surface of the photosensitive resin layer (B) upon exposing the photosensitive resin layer (B) to light. As a result, the pattern profile of the photosensitive resin layer (B) after the exposure/development becomes taper, and a tip of the pattern which will become a dot on a printing is tapered. Consequently, an area of a pattern tip on a printing face (ink fitting portion) is reduced, and thus sharpness of the printing can be enhanced.

In the preferable preparation of the resin composition for forming the ink holding layer, components for forming the layer may be dissolved in an organic solvent, and the solution may be applied to the photosensitive resin layer. Subsequent evaporation of the organic solvent may give a masking material layer. Examples of the organic solvent may include ethers such as dibutyl ether, isopropyl ether, dioxane and tetrahydrofuran, ketones such as acetone, diethyl ketone, methyl ethyl ketone, methyl isobutyl ketone, methyl propyl ketone, and cyclohexanone, esters such as ethyl acetate, n-propyl acetate and n-butyl acetate, and aromatic hydrocarbons such as benzene, toluene and xylene, and the like. These organic solvents may be used alone or in mixture.

The flexographic original plate of the present invention may be provided with a cover sheet on the ink holding layer (C) for protecting the layer (C). The cover sheet may be any of cover sheets of metals, plastic films, papers and complexed forms thereof that are publicly known and usually used for the flexographic plate. These include polymer films formed by addition polymerization polymers and linear condensed polymers, transparent foams and fabrics, non-woven fabrics, e.g., glass fiber non-woven fabrics, and metals such as steel and aluminium. Preferably, a polyethylene film, a polyester film, a polypropylene film or a laminate thereof is used. A film is suitable as this cover sheet, and a thickness thereof is preferably 20 to 200 μm. The cover sheet may be coated with a peeling layer so that the peeling layer is placed between this cover sheet and the masking material layer.

A light-shielding ink suitable for forming an ink printing pattern in the ink holding layer (C) of the present invention is not particularly limited as long as it has a property capable of absorbing the light for exposure in patterning of the photosensitive resin layer (B) so as to block transmission of the light therethrough and favorably fixes into the ink holding layer (C). A suitable specific example thereof may include an ink containing a water-soluble dye having a high absorbance of the light at a wavelength region of 300 to 450 nm.

The water-soluble dye may be appropriately selected from those having the high absorbance at an absorbance spectrum of 300 to 450 nm when present in water and a solubility of usually 5% by weight or more, and preferably 7% by weight or more in water. Specific examples of such pigments may include a water-soluble copper phthalocyanine dye, a yellow dye, a brown dye, and the like, and these water-soluble dyes may be used in combination with two or more.

Examples of the water-soluble copper phthalocyanine dye may include C.I. direct blue 86, 87, 199, C.I. acid blue 249, and are preferably C.I. direct blue 86 and 199.

Examples of the water-soluble yellow dyes may include C.I. acid yellow 17, 19, 23, 25, 39, 40, 42, 44, 49, 50, 61, 64, 76, 79, 110, 127, 135, 143, 151, 159, 169, 174, 190, 195, 196, 197, 199, 218, 219, 220, 227, C.I. direct yellow 1, 8, 11, 12, 24, 26, 27, 33, 39, 44, 50, 58, 85, 86, 87, 88, 89, 98, 110, 132, 142, 144, and are preferably direct yellow 132 and 142.

Examples of the brown dye may include C.I. direct brown 1, 2, 6, 25, 27, 33, 37, 39, 59, 60, 62, 95, 99, 100, 104, 106, 112, 113, 115, 167, 169, 175, 195, 210, and are preferably C.I. direct brown 195.

The water-soluble copper phthalocyanine dye usually has an absorbance maximum at 550 to 650 nm and 300 to 400 nm, and the water-soluble yellow dye or brown dye usually has an absorbance maximum at 350 to 450 nm.

The wavelength of a light source usable for the method for producing the relief printing plate of the invention is usually 300 to 400 nm. Therefore, to efficiently absorb and block the irradiated light, it is preferable to combine the water-soluble copper phthalocyanine dye with the water-soluble yellow dye and/or brown dye.

The light-shielding ink used for the present invention contains the water-soluble dye and is prepared using water as a medium. Preferably a content of anions such as $Cl^-$ and $SO_4^{2-}$ in the water-soluble dye is low. A rough standard of the content is 5% by weight or less, preferably 3% by weight or less, and more preferably 1% by weight or less as a total content of $Cl^-$ and $SO_4^{2-}$ in a phthalocyanine pigment, and 1% by weight or less in the ink. To produce the water-soluble dye containing a small amount of $Cl^-$ and $SO_4^{2-}$, a desalting treatment may be given to a dried article or a wet cake of the water-soluble dye by a usual method using a reverse osmotic membrane or by stirring in a mixed solvent of water and alcohol, filtrating and drying. Alcohol used is lower alcohol with 1 to 4 carbons, preferably alcohol with 1 to 3 carbons, and more preferably methanol, ethanol or 2-propanol. A method for desalting by heating to a temperature close to a boiling temperature of alcohol used and then cooling may also be employed at the desalting treatment with alcohol. The content of $Cl^-$ and $SO_4^{2-}$ is measured by, for example, an ion chromatography method.

In the light-shielding ink used for the present invention, preferably a content of heavy metals (ion) such as zinc and iron and metals (cation) such as calcium and silica is low in the water-soluble dye used therefor (excluding the metal contained in a backbone of a pigment structure, e.g., copper in a phthalocyanine backbone). A rough standard of the content is about 500 ppm or less for each of heavy metals (ion) such as zinc and iron and metals (cation) such as calcium and silica in a purified/dried article of the pigment. The content of the heavy metals (ion) and the metals (cation) is measured by the ion chromatography method, an atomic absorbance method, or an inductively coupled plasma emission analysis method.

The water-soluble dye is contained at 5 to 20% by weight, and preferably 5 to 15% by weight in the light-shielding ink.

The light-shielding ink used for the present invention is prepared using water as the medium. The water-soluble dye with the aforementioned property obtained in this manner is contained at 5 to 20% by weight in this light-shielding ink. A water-soluble organic solvent is further contained if necessary in the range where the effects of the invention are not impaired in this light-shielding ink. This water-soluble organic solvent is used as a dye dissolving agent, an anti-drying agent (wetting agent), a viscosity modifier, a permeation accelerating agent, a surface tension modifier, and an anti-foaming agent. Additionally, examples of ink preparing agents may include additives known publicly such as a preservative/anti-fungus agent, a pH adjuster, a chelating reagent, an anti-corrosion agent, an ultraviolet light absorbing agent, a viscosity modifier, a dye dissolving agent, a surface tension modifier, an anti-foaming agent and a dispersant. The content of such a water-soluble organic solvent is 0 to 60% by weight, and preferably 10 to 50% by weight based on the entire ink, and the ink preparing agent is favorably used at 0 to 25% by weight, and preferably 0 to 20% by weight based on the entire ink. The remaining portion other than the aforementioned ingredient is water.

Examples of the water-soluble organic solvent used for this light-shielding ink may include alkanol having 1 to 4 carbon atoms such as methanol, ethanol, n-propanol, isopropanol, n-butanol, isobutanol, secondary butanol and tertiary butanol; carboxylic acid amide such as N,N-dimethylformamide or N,N-dimethylacetoamide; heterocyclic ketone such as 2-pyrrolidone, N-methyl-2-pyrrolidone, 1,3-dimethylimidazolizine-2-one or 1,3-dimethylhexahydropyrimido-2-one; ketone or keto alcohol such as acetone, methyl ethyl ketone or 2-methyl-2-hydroxypentane-4-one; cyclic ether such as tetrahydrofuran or dioxane, a monomer having a (C2 to C6) alkylene unit or oligomer, polyalkylene glycol or thioglycol thereof such as ethylene glycol, 12- or 1,3-propylene glycol, 1,2- or 1,4-butylene glycol, 1,6-hexylene glycol, diethylene glycol, triethylene glycol, tetraethylene glycol, dipropylene glycol, thiodiglycol, polyethylene glycol or polypropylene glycol; polyol (triol) such as glycerine and hexane-1,2,6-triol; (C1 to C4) alkyl ether of polyvalent alcohol such as ethylene glycol monomethyl ether or ethylene glycol monoethyl ether or ethylene glycol monobutyl ether, diethylene glycol monomethyl ether or diethylene glycol monoethyl ether or diethylene glycol monobutyl ether or triethylene glycol monomethyl ether or triethylene glycol monoethyl ether; γ-butyrolactone; or dimethyl sulfoxide, and the like.

The preferable water-soluble organic solvent used for the light-shielding ink may include monovalent or polyvalent alcohol having 3 to 8 carbon atoms and 2-pyrrolidone which may have an alkyl substituent having 1 to 3 carbon atoms, and polyvalent alcohol having 2 to 3 hydroxy groups is preferable. Specifically, isopropanol, glycerine, mono-, di- or tri-ethylene glycol, mono-, di- or tri-propylene glycol, polyethylene glycol having an average molecular weight of 200 to 1000, polypropylene glycol having an average molecular weight of 200 to 700, 2-pyrrolidone, N-methyl-2-pyrrolidone or butanol is used. More preferably, isopropanol, glycerine, diethylene glycol, propylene glycol, polyethylene glycol having an average molecular weight of 200 to 600, polypropylene glycol having an average molecular weight of 200 to 400 or 2-pyrrolidone is used. These water-soluble organic solvents are used alone or in mixture.

Examples of the preservative/anti-fungus agent may include organic sulfur based, organic nitrogen sulfur based, organic halogen based, haloallylsulfone based, iodine propargyl based, N-haloalkylthio based, nitrile based, pyridine based, 8-oxyquinoline based, benzothiazole based, isothiazoline based, dithiol based, pyridine oxide based, nitropropane based, organic tin based, phenol based, quaternary ammonium salt based, triazine based, thiadiazine based, anilide based, adamantane based, dithiocarbamate based, bromated indanon based, benzylbromoacetate based, and inorganic salt based compounds. An example of the organic halogen based compound may include sodium pentachlorophenol. An example of the pyridine oxide compound may include sodium 2-pyridinethiol-1-oxide, an example of the inorganic salt based compound may include sodium acetate anhydrate, and examples of the isothiazoline compound may include 1,2-benzoisothiazoline-3-one, 2-n-octyl-4-isothiazoline-3-one, 5-chloro-2-methyl-4-isothiazoline-3-one, 5-chloro-2-methyl-4-isothiazoline-3-one magnesium chloride, 5-chloro-2-methyl-4-isothiazoline-3-one calcium chloride and 2-methyl-4-isothiazoline-3-one calcium chloride. Other preservative/anti-fungus agent may include sodium pyruvate sodium benzoate (e.g., Proxel GXL(S), Proxel XL-2(S) supplied from Avecia).

As the pH adjuster, any substance may be used as long as it can control pH of the ink in the range of 6.0 to 11.0 for the purpose of enhancing storage stability of the ink. Examples thereof may include alkanol amine such as diethanolamine, triethanolamine and tris(hydroxymethyl)aminomethane; hydroxide of alkali metals such as lithium hydroxide, sodium hydroxide and potassium hydroxide; ammonium hydroxide; carbonate salts of alkali metals such as lithium carbonate, sodium carbonate and potassium carbonate.

Examples of the chelating reagent may include sodium ethylenediaminetetraacetate, sodium nitrotriacetate, sodium hydroxyethylethylenediaminetriacetate, sodium diethylenetriaminepentaacetate, and sodium uramildiacetate. Examples of the anti-corrosion agent may include an acid sulfite salt, sodium thiosulfate, ammonium thioglycolate, diisopropylammonium nitrite, pentaerythritol tetranitrate, dicyclohexylammonium nitrite and tolyltriazole.

Examples of the ultraviolet light absorbing agent may include compounds which absorb the ultraviolet light and emit fluorescence, i.e. fluorescent brighteners, such as benzophenone based compounds, benzotriazole based compounds, cinnamate based compounds, triazine based compounds, stilbene based compounds or benzoxazole based compounds.

The viscosity modifier may include water-soluble polymer compounds in addition to the water-soluble organic solvents, and examples thereof may include polyvinyl alcohol, cellulose derivatives, polyamine, and polyimine.

Examples of the dye dissolving agent may include urea, s-caprolactam, and ethylene carbonate.

The surface tension modifier may include surfactants, and examples thereof may include anionic surfactants, ampholytic surfactants, cationic surfactants and nonionic surfactants. The anionic surfactants may include alkylsulfonyl-carbonate salts, α-olefin sulfonate salts, polyoxyethylene alkyl ether acetate salts, N-acylamino acid and salts thereof, N-acylmethyl taurine salts, alkylsulfate salt polyoxyalkyl ether sulfate salts, alkylsulfate salt polyoxyethylene alkyl ether phosphate salts, rosin acid soap, castor oil sulfate ester salts, lauryl alcohol sulfate ester salts, alkylphenol type phosphate ester, alkyl type phosphate ester, alkylallyl sulfonate hydrochloric acid, diethyl sulfosuccinate salts, and diethylhexyl sulfosuccinate dioctyl sulfosuccinate salts. As the cationic surfactants, there are 2-vinylpyridine derivatives and poly 4-vinylpyridine derivatives. As the ampholytic surfactants, there are betaine lauryidimethylamino acetate, betaine 2-alkyl-N-carboxymethyl-N-hydroxyethyl imidazolium, betaine palm oil fatty acid amidepropyldimethylamino acetate, polyoctylpolyaminoethyl glycine and imidazoline derivatives. The nonionic surfactants may include ether based ones such as polyoxyethylene nonylphenyl ether, polyoxyethylene octylphenyl ether, polyoxyethylene dodecylphenyl ether, polyoxyethylene oleyl ether, polyoxyethylene lauryl ether, polyoxyethylene alkyl ether, polyoxyarylkyl alkyl ether; ester based ones such as polyoxyethylene oleic acid, polyoxyethylene oleate ester, polyoxyethylene distearate ester, sorbitan laurate, sorbitan monostearate, sorbitan monooleate, sorbitan sesquioleate, polyoxyethylene monooleate, and polyoxyethylene stearate; and acetylene glycol based ones such as 2,4,7,9-tetramethyl-5-decine-4,7-diol, 3,6-dimethyl-4-octine-3,6-diol and 3,5-dimethyl-1-hexine-3-ol (e.g., Surfynol 104, 82, 465, Olfin STG supplied from Nissin Chemical Industry Co., Ltd.). These ink preparing agents are used alone or in mixture.

A surface tension of the light-shielding ink used for the present invention is usually 25 to 70 mN/m, and more preferably 25 to 50 mN/m. A viscosity of this light-shielding ink is preferably 30 mPa·s or less, and is more preferably adjusted to 20 mPa·s or less.

As the anti-foaming agent, a fluorine based or silicone based compound is used if needed.

When this light-shielding ink is produced, the order to dissolve respective chemicals is not particularly limited. When preparing the ink, it is preferable to use ion-exchange water or distilled water with less impurities. Furthermore, a contaminant may be eliminated by microfiltration using a membrane filter if necessary. It is preferable to perform the microfiltration when used as the ink for an inkjet printer. A pore size of the filter for the microfiltration is usually 1 to 0.1 μm, and preferably 0.8 to 0.2 μm.

To record an image pattern on the ink holding layer (C) using this light-shielding ink, a container containing this light-shielding ink may be set at a predetermined position of an inkjet printer, and the pattern may be printed in the ink holding layer (C) by a usual method using the inkjet printer. Examples of the inkjet printer may include a printer of a piezo mode taking advantage of mechanical vibration and a printer of a bubble jet (registered trade mark) mode taking advantage of a pressure when bubbles are generated in the ink by heating.

No precipitation and no separation occur in this light-shielding ink during the storage. Therefore, when this light-shielding ink is used in the inkjet printer, a jet opening at an inkjet recording head is never occluded. In the light-shielding ink used for the invention, no change of physical quality occurs even when used for a relatively long time under a certain recycle in a continuous mode of inkjet printer or used intermittently in an on-demand mode of inkjet printer.

This light-shielding ink can block the light for exposure in the production of the relief printing plate because it has a high absorbance of the light at a wide wavelength region centered on 350 nm. Pigments suitably used for this light-shielding ink has high solubility in an aqueous solvent, and thus a pigment concentration can be made high, thereby forming a mask pattern with high light-shielding ability in the ink holding layer (C). A high-definition mask pattern may be formed using an inkjet system because no crystal of the pigment is precipitated, a jetting path is not bended and no clogging occurs at the jet opening.

Subsequently, a specific example of the method for producing the flexographic original plate of the present invention will be shown. First, a photosensitive resin composition prepared by mixing an elastomeric binder, a monomer, a polymerization initiator and other ingredients is formed into a hot melt, and this is calendared so as to make a desired thickness, or using an extruder, the photosensitive resin composition is melted, mixed, deaerated and filtrated, subsequently extruded between a support substrate and a transient cover sheet, which is calendared to make a desired thickness. Alternatively, the photosensitive resin layer (B) is formed on the support substrate layer (A) by a method in which the support substrate and the cover sheet (D) are placed in a die and the photosensitive resin composition is extruded between the both. Subsequently, a composition composed of the aforementioned ink holding layer forming ingredients is directly coated and dried to obtain the ink holding layer (C). Alternatively, the composition (ink holding layer material) is coated and dried on the cover sheet (D) to make the ink holding layer, and this ink holding layer is fitted with pressure on the photosensitive resin layer (B). With or without removing the transient cover sheet (D), the fitted ink holding layer (C) is laminated with the photosensitive resin layer (B) formed on the support substrate layer (A) with heat or pressure to make the flexographic original plate. In the aforementioned production, it is also possible to produce by sequentially laminating the ink holding layer (C), the photosensitive resin layer (B) and the support substrate layer (A) on the cover sheet (D).

The mask pattern is recorded in the ink holding layer (C) of the flexographic original plate obtained by the method using the light-shielding ink and inkjet printer. In this case, the mask pattern by the light-shielding ink is not formed on the surface of the ink holding layer (C) but is formed in the layer by permeating the light-shielding ink into the ink holding layer (C). Thereby, the ink holding layer (C) becomes a mask layer.

The flexographic printing plate is produced by irradiating the light at a wavelength region of 300 to 700 nm to the original printing plate where the mask layer has been formed on the photosensitive resin layer (B), removing by a developer a non-irradiated area of the photosensitive resin layer (B), where the photosensitive resin layer (B) is not irradiated and cured because this light is blocked with an ink pattern to form into a printing plate image.

Chemical radiation irradiated on the photosensitive resin layer is electromagnetic wave with shorter wavelength than that of infrared light, preferably electromagnetic wave of visual light and ultraviolet light region, more preferably electromagnetic wave of 300 to 700 nm, and still more preferably electromagnetic wave of 300 to 400 nm. Examples of a light source of this chemical radiation may include a low pressure mercury lamp, a high pressure mercury lamp, an ultraviolet fluorescent light, a carbon arc lamp, a heavy hydrogen lamp, a tungsten lamp (tungsten iodine lamp, WI lamp, WI$_2$ lamp), a xenon lamp, and an excimer laser. A developer used in a development treatment may be any of an organic solution, water, an aqueous or a semi-aqueous solution as long as it dissolves the photosensitive resin layer, and selection of the developer depends on a chemical nature of the resin to be removed. Appropriate organic solvent developers may include aromatic or aliphatic hydrocarbon and aliphatic or aromatic halohydrocarbon solvent or a mixture thereof with appropriate alcohol. Semi-aqueous developers contain water or organic solvents miscible with water and alkali materials. Examples of the aqueous developers may include aqueous solutions containing water and other substances such as esters such as heptyl acetate and 3-methoxybutyl acetate; hydrocarbons such as petroleum fraction, toluene and decaline; chlorine based solvent such as tetrachloroethylene; amines such as monoethanolamine, diethanolamine and triethanolamine; sodium hydroxide; potassium hydroxide; sodium carbonate; and ammonia. It is also possible to use mixtures in which alcohols such as propanol, butanol and pentanol are added to these solvents. Any method of immersion, jetting from a nozzle or brushing with a brush may be employed for washing out.

An inkjet printer is suitable for a printing apparatus capable of being suitably used for the method for producing the relief printing plate of the present invention. Printing by the inkjet printer forms texts and pictures by jetting the ink from a nozzle onto a recording material such as paper. Depending on methods of jetting the ink, the method for printing may be roughly classified into a piezo method in which mechanical vibration is given to ink to jet using piezoelectric elements and a method for jetting the ink by taking advantage of a pressure generated by heating the ink to produce bubbles.

As described previously, the method for imparting the light-shielding ink in the ink holding layer (C) to record in the present invention is preferably an inkjet recording method, and the method may be any method as long as the ink can be effectively released from the nozzle and imparted to a recording medium in a shooting range. In particular, an inkjet mode where an ink received heat energy is rapidly changed in volume by bubbling and the ink is jetted from a nozzle by an action force due to this change, which is a method described in JP-54-59936-A may be effectively used.

EXAMPLES

The present invention will be illustrated in more detail with reference to the following Examples, but the following Examples are only exemplifications for suitably illustrating the invention, and do not limit the invention.

In the following illustrations, "parts" and "%" are based on weight unless otherwise described. As water-soluble dyes used in Examples for producing light-shielding ink 1 to 6, those given a desalting treatment by a reverse osmotic membrane followed by being dried at 80° C. were used.

Example for Producing Light-Shielding Ink 1

A solution composed of 5 parts of C.I. direct blue 199 (product name: Kayafect Turquoise RN liquid 150 supplied from Nippon Kayaku Co., Ltd.), 5 parts of C.I. direct yellow 132 (product name: Cartazol Yellow 3GF liquid supplied from Clariant AG), 15 parts of ethylene glycol, 0.05 parts of Surfynol 104PG50 (supplied from Nissin Chemical industry Co. Ltd.) and 74.95 parts of ion-exchange water was stirred, and caustic soda was added to make pH of an ink 8.0 to 9.5. Further, the solution was filtrated using a membrane filter of 0.45 μm to yield a light-shielding ink (1) suitably used for the present invention.

Example for Producing Light-Shielding Ink 2

A solution composed of 5 parts of C.I. direct blue 199, 5 parts of C.I. direct yellow 142 (product name: Kayarus Yellow PG supplied from Nippon Kayaku Co., Ltd.), 15 parts of ethylene glycol, 0.05 parts of Surfynol 104PG50 (supplied from Nissin Chemical industry Co. Ltd.) and 74.95 parts of ion-exchange water was stirred, and caustic soda was added to make pH of an ink 8.0 to 9.5. Further, the solution was filtrated using a membrane filter of 0.45 μm to yield a light-shielding ink (2) suitably used for the present invention.

Example for Producing Light-Shielding Ink 3

A solution composed of 5 parts of C.I. direct blue 199, 8 parts of C.I. direct brown 195 (product name: Kayarus Supra Brown GL125 supplied from Nippon Kayaku Co., Ltd.), 15 parts of ethylene glycol, 0.05 parts Surfynol 104PG50 (supplied from Nissin Chemical industry Co. Ltd.) and 71.95 parts of ion-exchange water was stirred, and caustic soda was added to make pH of an ink 8.0 to 9.5. Further, the solution was filtrated using a membrane filter of 0.45 μm to yield a light-shielding ink (3) suitably used for the present invention.

Example for Producing Light-Shielding Ink 4

A solution composed of 5 parts of C.I. direct blue 86 (product name: Kayarus Turquoise Blue GL supplied from Nippon Kayaku Co., Ltd.), 5 parts of C.I. direct yellow 132, 15 parts of ethylene glycol, 0.05 parts of Surfynol 104PG50 (supplied from Nissin Chemical industry Co. Ltd.) and 74.95 parts of ion-exchange water was stirred, and caustic soda was added to make pH of an ink 8.0 to 9.5. Further, the solution was filtrated using a membrane filter of 0.45 μm to yield a light-shielding ink (4) suitably used for the present invention.

Example for Producing Light-Shielding Ink 5

A solution composed of 5 parts of C.I. direct blue 86, 5 parts of C.I. direct yellow 142, 15 parts of ethylene glycol, 0.05 parts Surfynol 104PG50 (supplied from Nissin Chemical industry Co. Ltd.) and 74.95 parts of ion-exchange water was stirred, and caustic soda was added to make pH of an ink 8.0 to 9.5. Further, the solution was filtrated using a membrane filter of 0.45 μm to yield a light-shielding ink (5) suitably used for the present invention.

Example for Producing Light-Shielding Ink 6

A solution composed of 5 parts of C.I. direct blue 86, 8 parts of C.I. direct brown 195, 15 parts of ethylene glycol, 0.05 parts Surfynol 104PG50 (supplied from Nissin Chemical industry Co. Ltd.) and 71.95 parts of ion-exchange water was stirred, and caustic soda was added to make pH of an ink 8.0 to 9.5. Further, the solution was filtrated using a membrane filter of 0.45 μm to yield a light-shielding ink (6) suitably used for the present invention.

Figure 1:
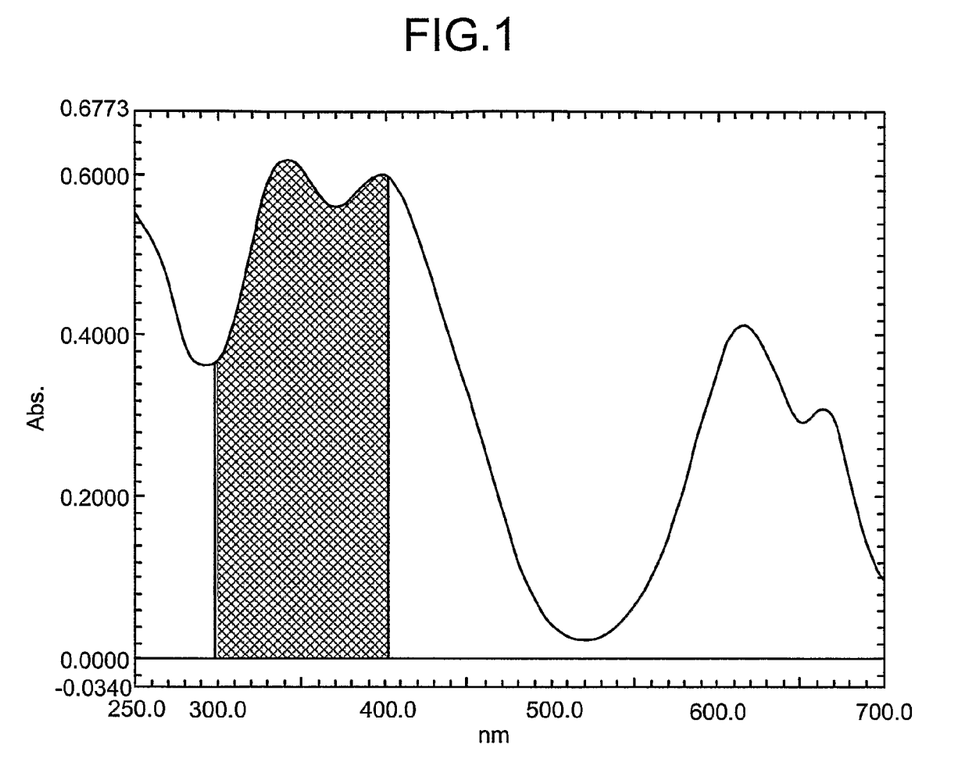
FIG. 1 is a graph showing an absorbance curve of a light-shielding ink suitably used for the present invention.

A chart of an absorbance curve of the light-shielding ink (1) obtained in the above Example for Producing Light-shielding Ink 1 was shown in FIG. 1. An integral value of the absorbance curve is also referred to as ΣOD or an area value, and is the integral value of the absorbance in a certain wavelength interval. In this figure, a shaded area is the integral value of the absorbance between 300 and 400 nm.

The integral value of the absorbance between 300 to 400 nm may be measured as follows.

(Measurement Method)

An absorbance of a solution where 1.0 g of the ink has been diluted with ion-exchange water up to 5000 times is measured using a spectrophotometer having a condition of 25° C., light sources (use a heavy hydrogen [$D_2$] lamp at 200 to 360 nm and a tungsten (WI) lamp at 300 to 400 nm), a slit width of 2.0 nm and a transmitted light path length of 10 mm. An integral value (nm×Abs.) of an absorbance curve from 300 nm to 400 nm is calculated.

2.0 g of the light-shielding ink (1) in the Example for Producing Light-shielding Ink 1 was diluted to 500 mL with ion-exchange water in a 500 mL measuring flask. 5 mL of the diluted solution was taken by a hole pipette, which was then diluted to 100 mL with ion-exchange water in a 100 mL measuring flask, to thereby prepare a 5000 times dilution of the ink. FIG. 1 shows the absorbance curve between 700 nm and 250 nm of this 5000 times dilution of the ink measured using a spectrophotometer (UV-2550 supplied from Shimadzu Corporation) having a condition of 25° C., light sources (use a heavy hydrogen [$D_2$] lamp at 200 to 360 nm and a tungsten lamp (WI) at 300 to 400 nm), a slit width of 2.0 nm and a transmitted light path length of 10 mm. The integral value (nm×Abs.) of the absorbance between 300 nm and 400 nm was 55.3475 at that time.

Example 1

Optical densities shown in the following Examples were measured using a spectrophotometer (product name: U-2000, supplied from Hitachi Ltd.

An aqueous solution of 5% polyvinyl butyral (product name: S-Lec KW-3 supplied from Sekisui Chemical Co., Ltd.) was coated using a bar coater on a PET film as a cover sheet (D) having a thickness of 100 μm so that a coated film thickness after drying was 2 μm, dried at 100° C. for 5 min, and subsequently an ink holding layer (C) capable of recording a good image by the light-shielding ink (1) was formed. An optical density for light with a wavelength of 370 nm of this ink holding layer (C) was measured, and consequently it was 0.0.

A photosensitive resin composition was prepared by dissolving 100 parts by weight of a styrene butadiene copolymer with an average molecular weight of 240,000 (product name: D-1155, supplied from JSR Shell Elastomer KK), 70 parts by weight of liquid 1,2-polybutadiene with an average molecular weight of 1,000 (product name: Nisso PB-100, supplied from Nippon Soda Co., Ltd.), 10 parts by weight of trimethylolpropane triacrylate, 3 parts by weight of methoxyphenyl acetophenone, 0.05 parts by weight of 2,6-di-tert-butyl-4-hydroxytoluene and 0.002 parts by weight of oil blue #503 (supplied from Orient Chemical Industries) in a solvent composed of 0.2 parts by weight of tetrahydrofuran. The composition was pressed into an extruder using a pump for high viscosity, and extruded up to a thickness of 2.84 mm with kneading in the extruder on an (A) layer composed on polyethylene terephthalate sheet to obtain a photosensitive resin layer (B).

Faces of the photosensitive resin layer (B) and the ink holding layer (C) obtained in the above were attached and laminated using a compression roller to afford a multiple layer photosensitive product (flexographic plate) where a substrate layer (A)—the photosensitive resin layer (B)—the ink holding layer (C)—the cover sheet (D) were sequentially laminated and integrated.

The cover sheet (D) of the resulting photosensitive product for the flexographic plate was peeled off, and the water-soluble dye ink (the light-shielding ink (1)) containing pigments having absorbance property for the light in the wavelength region of 300 to 400 nm was jetted on the ink holding layer (C) in accordance with a predetermined pattern using a flat bed inkjet printer supplied from Roland D. G. to form a predetermined mask pattern in the ink holding layer (C). The mask pattern formed in the ink holding layer (C) may be an image of a text or a picture, and in the present Example, a text pattern was formed. An optical density for the light with a wavelength of 370 nm in the mask pattern area formed by the light-shielding ink was measured, and found to be 3.0.

Subsequently, a back exposure at 75 mJ/cm$^2$ was performed by irradiating ultraviolet light having a wavelength centered on 370 nm from the side of the (A) layer, and consecutively a main exposure at 2500 mJ/cm$^2$ was performed from the side of an image layer. Thereafter, development was performed at a liquid temperature of 25° C. for 4 min using an aromatic hydrocarbon based developer (product name: FDO-S2 supplied from Tokyo Ohka Kogyo Co., Ltd.) as the developer. No developmental residue was observed on the resulting plate face. After the development, the plate was dried at 55° C. for 50 min, subsequently a post-treatment was performed using an ultraviolet fluorescent lamp having a wavelength centered on 250 nm, and further a post-exposure at 3000 mJ/cm$^2$ was performed using the ultraviolet light having the wavelength centered on 370 nm to afford a flexographic plate. Printing was performed using this flexographic plate, and consequently a printed matter having a sharp text was obtained.

Example 2

A flexographic plate was made as was the case with Example 1, except that an aqueous solution of 5% polyvinyl butyral (product name: S-Lec KS-3 supplied from Sekisui Chemical Co., Ltd., oxygen permeation coefficient: $4 \times 10^{-11}$) was coated so that a film thickness of the ink holding layer (C) was 8 μm. Printing was performed using the produced flexographic plate, and consequently a printed matter having a sharp text was obtained.

Example 3

A flexographic plate was made as was the case with Example 1, except that polyvinyl pyrrolidone (product name: Luviskol K90 supplied from BASF Japan) was used for the ink holding layer (C). Printing was performed using the produced flexographic plate, and consequently a printed matter having a sharp text was obtained.

Example 4

A flexographic plate was made as was the case with Example 1, except for making the film thickness of the ink holding layer 0.8 μm. Printing was performed using the produced flexographic plate, and consequently a printed matter having a sharp text was obtained.

Comparative Examples

Flexographic plates were made as was the case with Example 1, except for changing the film thickness (0 μm, 0.3 μm, 17 μm) of the ink holding layer (C). A printing test was performed using the produced flexographic plates. The results were ranked according to the following evaluation criteria, and shown in Table 1.

(Evaluation Criteria)

A. A flexographic plate having a relief shape suitable for printing was obtained and a printed matter having a sharp text was printed.

B. A flexographic plate having a relief shape which is not suitable for printing was obtained, and a text was not sharp, but a printed matter in a qualitatively and practically usable range was printed.

C. A flexographic plate having a relief shape suitable for printing was obtained, but a wrinkle sometimes occurs due to decrease of a film physical property of the photosensitive resin layer (B), and the plate is not suitable for printing.

D. No flexographic plate material having a relief shape suitable for printing was obtained, and a printed matter with smeared text out of the practically usable range was printed.

TABLE 1

|  | Thickness of Layer (C) (μm) | | | | | |
| --- | --- | --- | --- | --- | --- | --- |
|  | 0 (No (C) layer) | 0.3 | 0.8 | 2 | 8 | 17 |
| Result of printing | D | D | B | A | A | C |

In the ink holding layer (C) with a film thickness of 8 μm or more, almost no change in a radiation shielding effect was observed, and no effect due to the film thickness was obtained.

INDUSTRIAL APPLICABILITY

As described in the above, the present invention is characterized by using the photosensitive laminate characterized in that the photosensitive resin layer (B) having the photosensitivity to the light in the predetermined wavelength region and the ink holding layer (C) in which the pattern is formed by the light-shielding ink are at least laminated on the support substrate (A), and that the light-shielding layer (C) is substantially transparent for the light in the predetermined wavelength region and has a property to retain the light-shielding ink therein, as a photosensitive laminate original printing plate for the relief printing.

In the present invention having the above characteristics and constitution, the ink holding layer has been formed directly on the photosensitive resin layer, and the mask pattern is formed in this ink holding layer by the light-shielding ink. Therefore, it is possible to prevent problems which have occurred when using the conventional mask film or the replacement thereof and pattern disturbance due to bleeding and repelling which have occurred when the mask pattern is directly formed on the photosensitive resin layer by an ink composition. As a result, according to the invention, it is possible to provide a relief original printing plate where a mask layer may be formed without damaging the surface of the photosensitive resin layer which is an underlayer thereof and with excellent contrast, and a method for producing a relief printing plate using the relief original printing plate.

The invention claimed is:

1. A photosensitive laminate for relief printing comprising:
a support substrate (A);
a photosensitive resin layer (B) provided on said support substrate (A), said photosensitive resin layer (B) having a photosensitivity to light in a wavelength region of 300 nm to 400 nm; and
an ink holding layer (C) provided directly on said photosensitive resin layer (B) and formed from a water-soluble composition,
a light-shielding pattern diffused inside said layer (C), said light-shielding pattern comprising a light-shielding ink containing a water-soluble dye
wherein said light-shielding ink is present only in said ink holding layer (C), and is formed into the pattern of the light-shielding pattern,
wherein said light-shielding ink absorbs light in the wavelength region of 300 nm to 400 nm, and
wherein an integral value of light absorbance (light path length of 10 mm) of said light-shielding ink in a wavelength region of 300 nm to 400 nm is 45 nm times Abs, or more, when said light-shielding ink has been diluted 5,000 times with water.

2. The photosensitive laminate for relief printing according to claim 1 wherein said ink holding layer (C) is formed into a thickness of 0.5 to 15 μm.

3. The photosensitive laminate for relief printing according to claim 1 wherein said water-soluble composition contains a resin which has at least one of the following properties selected from the group consisting of being soluble in water-soluble solvent, soluble in a water-soluble organic solvent, swellable with a water-soluble solvent, swellable with a water-soluble organic solvent, dispersible in a water-soluble solvent, and dispersible in a water-soluble organic solvent.

4. The photosensitive laminate for relief printing according to claim 1 wherein a solubility of said water-soluble dye in water is 7% by weight or more when the pH of said water is in a neutral to alkali range.

5. A method for producing a relief printing plate comprising the steps of:
irradiating a photosensitive resin layer (B) with a light in a wavelength region of 300 nm to 400 nm using a light-shielding pattern formed on an ink holding layer (C) of the photosensitive laminate for relief printing according to claim 1 as a mask; and
removing using a developing solution a non-irradiated part of said photosensitive resin layer (B) that remains uncured by not being irradiated with said light in a wavelength region of 300 nm to 400 nm, to form a resin layer having a convex pattern on a support (A) for printing.

6. The method for producing the relief printing plate according to claim 5, wherein said light-shielding pattern is printed onto said ink holding layer using an inkjet recording apparatus.

7. The photosensitive laminate for relief printing according to claim 1 wherein said ink holding layer (C) comprises polyvinyl butyral or polyvinyl pyrrolidone.

8. The method for producing the relief printing plate according to claim 5 wherein said ink holding layer (C) comprises polyvinyl butyral or polyvinyl pyrrolidone.

9. A method of making a photosensitive laminate for relief printing according to claim 1 comprising:
providing said photosensitive resin layer (B) on the support substrate (A);
providing the ink holding layer (C) directly on the photosensitive resin layer (B);
permeating the light-shielding ink containing the water-soluble dye into said layer (C) to form a light-shielding pattern in said layer (C).

* * * * *